(12) United States Patent
Kondou et al.

(10) Patent No.: US 7,247,818 B2
(45) Date of Patent: Jul. 24, 2007

(54) SUBSTRATE HEATING APPARATUS AND MANUFACTURING METHOD FOR THE SAME

(75) Inventors: Nobuyuki Kondou, Handa (JP); Hideyoshi Tsuruta, Tokai (JP)

(73) Assignee: NGK Insulators, Ltd., Nagoya (JP)

( * ) Notice: Subject to any disclaimer, the term of this patent is extended or adjusted under 35 U.S.C. 154(b) by 0 days.

(21) Appl. No.: 11/149,080

(22) Filed: Jun. 9, 2005

(65) Prior Publication Data

US 2006/0011610 A1     Jan. 19, 2006

(30) Foreign Application Priority Data

Jun. 16, 2004   (JP) .......................... P2004-178659

(51) Int. Cl.
*H05B 3/68*   (2006.01)
*C23C 16/00*  (2006.01)

(52) U.S. Cl. .................................. 219/444.1; 118/725

(58) Field of Classification Search ............ 219/443.1, 219/444.1, 542–548; 118/724, 725
See application file for complete search history.

(56) References Cited

U.S. PATENT DOCUMENTS

| | | | |
|---|---|---|---|
| 6,423,949 B1 * | 7/2002 | Chen et al. | 219/444.1 |
| 6,730,175 B2 * | 5/2004 | Yudovsky et al. | 118/728 |
| 2002/0162630 A1 * | 11/2002 | Satoh et al. | 156/345.51 |
| 2004/0011780 A1 | 1/2004 | Sun et al. | |

FOREIGN PATENT DOCUMENTS

JP       2003-133195       5/2003

\* cited by examiner

*Primary Examiner*—Sang Y. Paik
(74) *Attorney, Agent, or Firm*—Burr & Brown

(57) ABSTRACT

A substrate heating apparatus includes a ceramic base having a concave heating surface on which a substrate is placed, and a resistance heating element buried in the ceramic base. The central part of the concave heating surface defines the lowest point of the heating surface and the peripheral part of the concave heating surface defines the highest point of the heating surface.

10 Claims, 4 Drawing Sheets

SUBSTRATE HEATING APPARATUS AND MANUFACTURING METHOD FOR THE SAME

CROSS REFERENCE TO RELATED APPLICATIONS

This application is based upon and claims the benefit of priority from prior Japanese Patent Application No. P2004-178659, filed on Jun. 16, 2004; the entirety of which are incorporated herein by reference.

BACKGROUND OF THE INVENTION

1. Field of the Invention

The present invention relates to a substrate heating apparatus and manufacturing method for the same.

2. Description of the Related Art

As a substrate heating apparatus in a semiconductor manufacturing apparatus, ceramic heaters have been conventionally used. In this ceramic heater, a linear resistance heating element is buried in a disc-shaped ceramic base. A ceramic heater with an electrostatic chuck function has also been widely used. In this ceramic heater, an electrostatic chuck electrode used for fixing a substrate by suction, is buried in a ceramic base together with a resistance heating element.

In these ceramic heaters having resistance heating elements buried in ceramic bases, the bases are made of ceramics having high corrosion resistance and the resistance heating elements are not exposed to the outside environment. Therefore, such ceramic heaters are used suitably for a CVD (chemical vapor deposition) apparatus, a dry-etching apparatus or the like in which corrosive gas is often used.

Normally, these ceramic heaters have a disc shape. In a substrate heating apparatus used in a CVD apparatus or a dry-etching apparatus, the terminals of a resistance heating element are drawn out without being exposed to corrosive gas. In order to do so, a construction is often employed where a cylindrical member is joined to the center of bottom of the ceramic base, and the terminals of the resistance heating element as well as a power supply rod connected thereto are accommodated in the cylindrical member. (See Japanese Patent Laid-Open Publication No. 2003-133195).

In these conventional ceramic heaters, the evenness of the heating surface on which a substrate is placed has been ensured by lapping or the like in order to improve the adherence with the substrate and the efficiency of heat transfer. A substrate placed on a highly-even heating surface shows a temperature distribution reflecting that of the heating surface of the ceramic heater.

A ceramic heater used for a semiconductor manufacturing apparatus is used in a wide temperature range depending on use. However, in order to improve production yield, it is preferred that the temperature of a substrate be made as uniform as possible. Therefore, highly uniform temperatures are also required with regard to the temperature of the heating surface of a substrate heating apparatus on which a substrate placed.

However, in a generally disc-shaped ceramic heater without a cylindrical member, heat radiation from its peripheral part is high. Therefore, the temperature of the peripheral part tends to be lower than that of the center part of the heating surface.

On the other hand, in a ceramic heater with a cylindrical member joined to the backside of the ceramic base, the temperature of the central part of the heating surface tends to drop due to a major heat transfer from the cylindrical member. Once the temperature of the central part becomes lower than that of the peripheral part, the central part of the ceramic base shrinks and the peripheral part expands. As a result, tensile stress occurs at the central part of the ceramic base. Typically, the ceramic base is highly resistant to compression stress, but remains susceptible to tensile stress. Moreover, grooves for drawing out wiring or the like are concentrated in the central part of the ceramic base. Therefore, having a low temperature at the central part causes a problem with the strength of the ceramic heater. In order to enhance the strength of the ceramic heater having the cylindrical member, the temperature of the central part of the ceramic heater must be higher than that of the peripheral part so that compression stress occurs at the central part of the ceramic heater.

However, if the temperature of the central part of the heating surface is higher than that of the peripheral part, and the heat throughout the heating surface is not uniform in a ceramic heater with or without cylindrical member joined to the ceramic base, a substrate placed on the flat heating surface will show a temperature distribution which reflects that of the heating surface of the ceramic heater. This makes it difficult to achieve a uniform temperature distribution of the substrate.

SUMMARY OF THE INVENTION

An object of the present invention is to provide a substrate heating apparatus and a manufacturing method for the same which can achieve a uniform temperature distribution for a substrate while maintaining the strength of the ceramic base.

A substrate heating apparatus according to one embodiment of the present invention comprises a ceramic base including a heating surface on which a substrate is placed, and a resistance heating element buried in the ceramic base. In addition, the heating surface is concave, where a central part is the lowest point and a peripheral part is the highest point.

According to the substrate heating apparatus, since the heating surface is a concave, a substrate placed on the heating surface can have a uniform temperature distribution even if the temperature of the central part of the heating surface is higher than that of the peripheral part of the heating surface. Therefore, the temperature distribution of a substrate placed on the heating surface can be made uniform while maintaining strength of the ceramic base.

A manufacturing method of the substrate heating apparatus according to one embodiment of the present invention comprises forming a ceramic base in which a resistance heating element is buried, and grinding the heating surface of the ceramic base so that a central part of the heating surface is the lowest point and a peripheral part of the heating surface is the highest point.

According to the manufacturing method for the substrate heating apparatus, a substrate placed on the heating surface can have a uniform temperature distribution simply by grinding the heating surface into a concave shape, even if the temperature of the central part of the heating surface is higher than that of the peripheral part of the heating surface.

Therefore, the temperature distribution of a substrate placed on the heating surface can be made uniform while maintaining strength of the ceramic base.

DETAILED DESCRIPTION OF THE INVENTION

Hereinafter, a substrate heating apparatus and a manufacturing method for the same according to the embodiments of the present invention are described with reference to the drawings.

First Embodiment

Figure 1A:
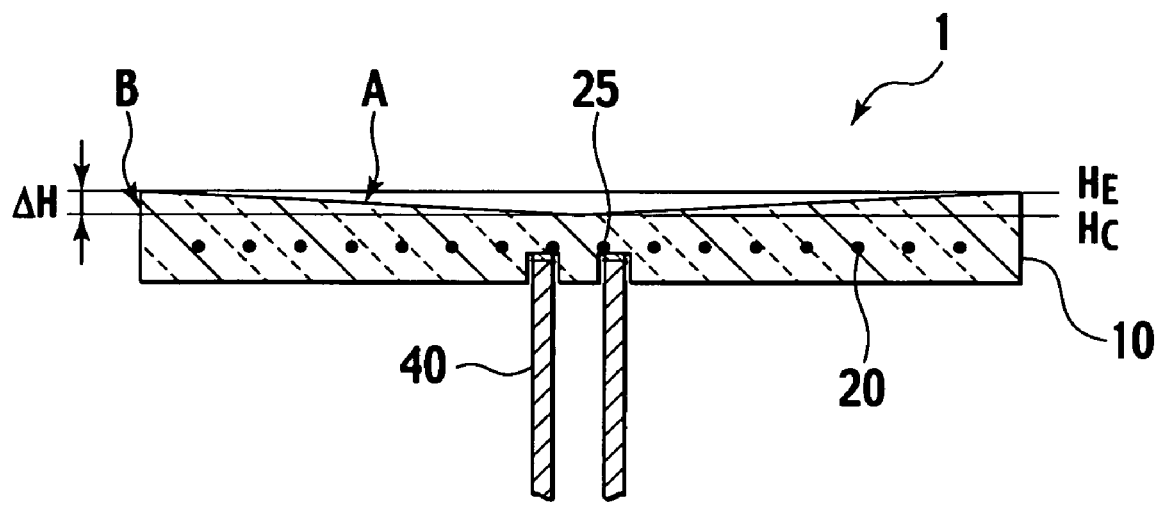
FIGS. 1A and 1B are a cross sectional view and a plan view, respectively, showing a substrate heating apparatus according to a first embodiment of the present invention.
Figure 1B:
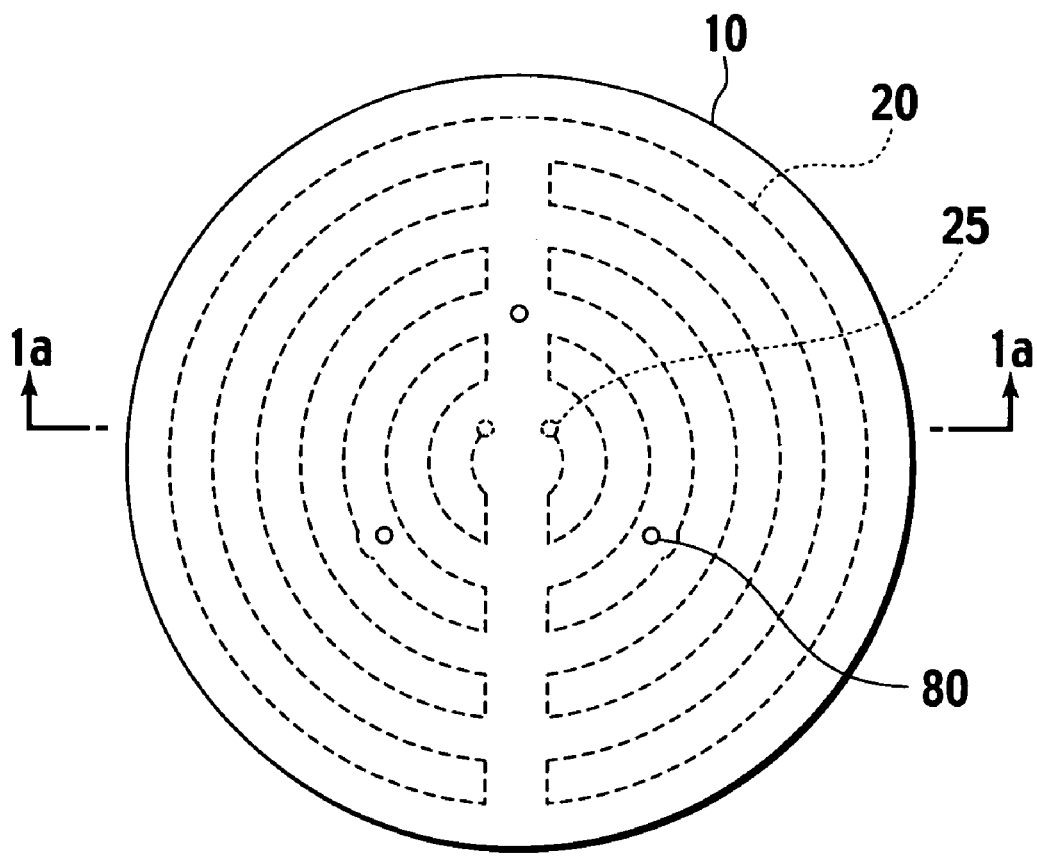

FIGS. 1A and 1B are a cross sectional view and a plan view, respectively, showing a substrate heating apparatus 1 according to the first embodiment of the present invention. As shown in FIGS. 1A and 1B, the substrate heating apparatus 1 includes a ceramic base 10, a resistance heating element 20, terminals 25 and power supplying rod 40.

The ceramic base 10 is formed by, for example, a ceramic sintered body having a platy shape, such as an approximate disc-shape. In the ceramic base 10, a linear resistance heating element 20 is buried. The ceramic base 10 has a heating surface A. In other words, one of the surfaces of the ceramic base 10 is the heating surface A. A substrate to be heated, such as a semiconductor substrate and a crystal liquid substrate, is placed on the heating surface A.

As shown in FIG. 1B, the resistance heating element 20 is buried in the ceramic base 10. The resistance heating element 20 can be a single linear metal bulk body, made of a high melting point material such as Mo, W, and WC, and folded so that two terminals 25 are brought to the center of the ceramic base 10, for example. The resistance heating element 20 can be formed so that pitches between neighboring parts are almost equal.

Terminals 25 connect to the resistance heating element 20. Terminals 25 input power from the power supply rod 40 to the resistance heating element 20. The power supply rod 40 connects to terminals 25 and provides power to the resistance heating element 20 via terminals 25.

The heating surface A is concave, where a central part is the lowest point and a peripheral part is the highest point in the substrate heating apparatus 1. Usually, in the substrate heating apparatus, heat radiation from its peripheral part is high, especially from the edge B of the heating surface A. Therefore, in the heating surface of the substrate heating apparatus, the temperature of the peripheral part of the heating surface tends to drop more easily than that of the central part.

On the other hand, when a substrate is placed on the heating surface A, the substrate comes into close contact with the peripheral part of the heating surface A due to its own weight. Therefore, a high heat transfer efficiency is obtained and the substrate temperature increases effectively in the peripheral part of the substrate. Nevertheless, in the central part of the substrate, there is a small gap between the heating surface A and the substrate, and the heat transfer efficiency in the central part thus becomes lower than that in the peripheral part. Accordingly, the heating surface is flat like the conventional apparatus, the temperature distribution of the surface of the substrate reflects that of the heating surface of the ceramic base as it is.

However, in the case of the substrate heating apparatus 1, the heating surface A is a concave. Therefore, the efficiency of heat transfer to a substrate is low in the central part of the heating surface A having a higher temperature, whereas the peripheral part of the heating surface A having lower temperature has a relatively high efficiency of heat transfer to a substrate. Therefore, the temperature distribution of the substrate surface can be corrected to achieve a uniform distribution.

The conditions of the concave shape are not limited. It is preferred that the conditions of the concave shape correct a temperature distribution of the heating surface A of the ceramic base 10. For example, conditions of the concave shape can vary depending on the conditions of the temperature distribution of the heating surface A of the ceramic base 10. Furthermore, in a ceramic base 10 having a heating surface A whose diameter is about 200 mm to about 300 mm, it is preferred that the concave shape of the heating surface A has a height difference $\Delta H$, between a height Hc of the central part of the heating surface A and a height He of the peripheral part, that is equal to or greater than about 10 μm. This can provide an effective temperature correction.

The ceramic base 10 can include at least one of aluminum nitride (AlN), silicon nitride (SiNx), silicon carbide (SiC) sialon and the like, for example. Specifically, the ceramic base 10 can be made of a material whose main ingredient is a non-oxide ceramic selected from a group of aluminum nitride, silicon nitride, silicon carbide, and sialon, or a composite material of at least two non-oxide ceramics selected from the group. In addition, the ceramic base 10 can have holes 80 for lift-pins.

According to the above substrate heating apparatus 1, the temperature distribution in the substrate surface can be made uniform using the resistance heating element 20 in the ceramic base 10 designed similarly to a conventional resistance heating element. Moreover, a substrate heating apparatus 1 can be provided which can provide a uniform temperature distribution in the substrate surface while maintaining the strength of the ceramic base 10 in a simple manner, even if the temperature of the central part of the heating surface A is higher than that of the peripheral part of the heating surface A.

This substrate heating apparatus 1 is suitable for heating a substrate such as a semiconductor substrate used in a semiconductor manufacturing apparatus and a liquid crystal substrate used in a crystal manufacturing apparatus. To be more specific, the substrate heating apparatus 1 can be used in a wide range of temperatures from room temperature to a high temperature equal to or greater than about 500° C. in accordance with a purpose. In order to improve production yield, it is preferred that the temperature of a substrate be made as uniform as possible. Therefore, the substrate heating apparatus is required to have a high uniform temperature distribution of a heating surface A. The substrate heating apparatus 1 can satisfy this requirement.

Second Embodiment

Figure 2A:
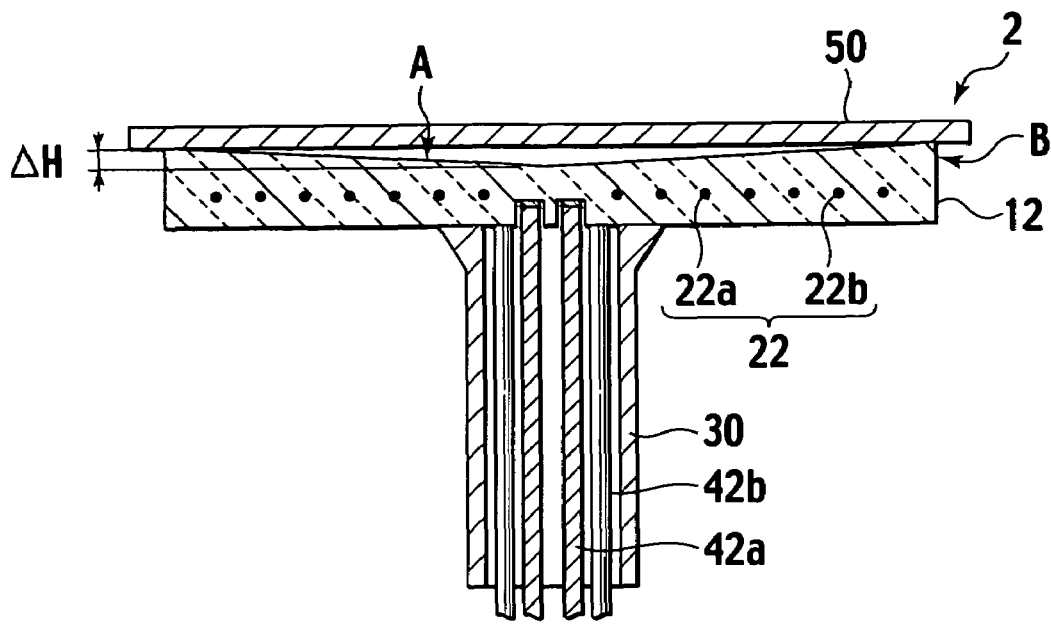
FIGS. 2A and 2B are a cross sectional view and a plan view, respectively, showing a substrate heating apparatus according to a second embodiment of the present invention.
Figure 2B:
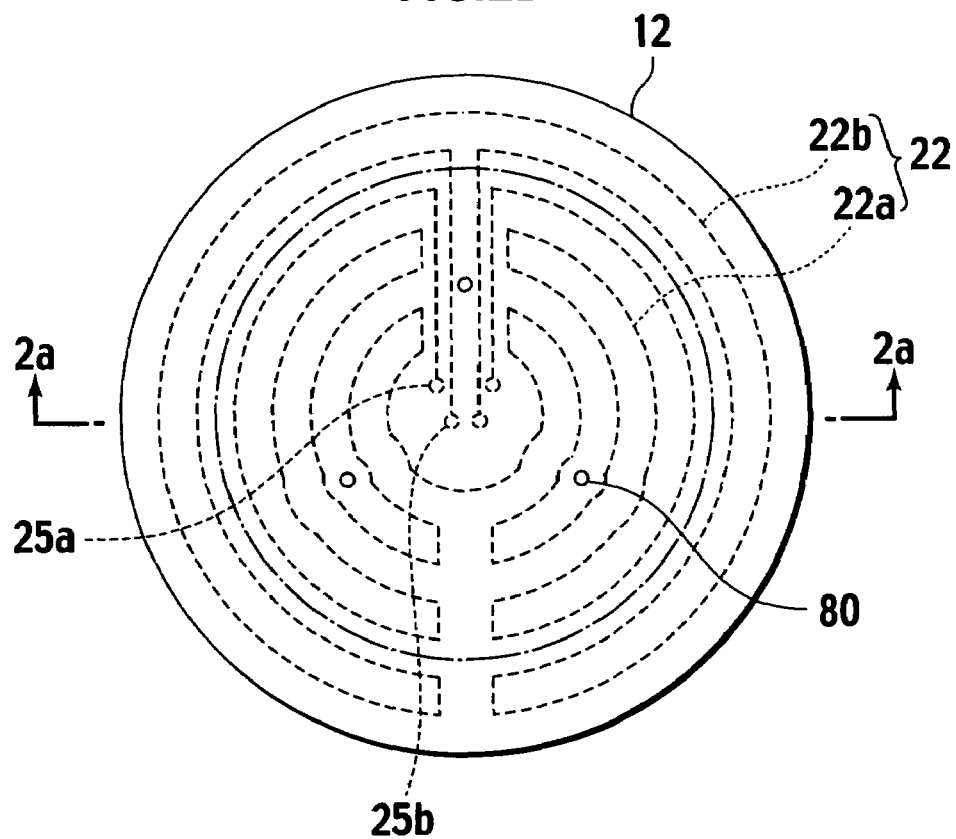

FIGS. 2A and 2B are cross sectional view and a plan view, respectively, showing a substrate heating apparatus 2 according to the second embodiment. Similarly to the substrate heating apparatus 1 of the first embodiment, a heating surface A of a ceramic base 12 is concave, where the central part is the lowest point and the peripheral part is the highest point. This substrate heating apparatus 2 has a cylindrical member 30 joined to the center region of the backside of the ceramic base 12, which is a surface of the ceramic base 12 on the opposite side to the heating surface A. Moreover, in the substrate heating apparatus 2, the resistance heating element 22 has a high temperature generating region generating a higher temperature than the temperature of a periphery of a region including a junction of the cylindrical member 30 in the region and buried in the ceramic base 12. In other words, the resistance heating element 22 has a high temperature generating region near the central region.

As shown in FIG. 2B, in the substrate heating apparatus 2, the resistance heating element 22 is divided into a resistance heating element zone 22a in the central part of the heating apparatus 2 and a resistance heating element zone 22b in the peripheral part, and both resistance heating element zones have individual terminals 25a,25b respectively. In other words, the resistance heating element 22 has a plurality of resistance heating element zones 22a and 22b. And terminals 25a and 25b are connected to resistance heating element zones 22a and 22b. An output value for the resistance heating element zone 22a in the central part is set so that the temperature thereof is higher than that of the resistance heating element zone 22b in the peripheral part. Therefore, the high temperature generating region is a resistance heating element zone 22a which is located in a central region of the ceramic base 12 and generates a higher temperature than the temperature of the periphery.

Power supply rods 42a and 42b supply power to the resistance heating element zones 22a and 22b via terminals 25a and 25b respectively. Power supply rods 42a and 42b are accommodated in the cylindrical member 30 joined to the backside of the ceramic base 12.

In a conventional substrate heating apparatus with a cylindrical member, the temperature of the central part of a heating surface is easily degreased because of great heat transfer from the cylindrical member. Where temperature of the central part is lower than that of the peripheral part, the central part of the ceramic base shrinks and the peripheral part of same expands. As a result, tensile stress tends to occur in the central part of the ceramic base. Meanwhile, in the substrate heating apparatus 2, temperature of the central part of the ceramic base 12 is higher than the peripheral part. Therefore, a compression stress area field is formed in the central part of the ceramic base 12 to improve the strength of the ceramic base 12, as the strength of the central part of the ceramic base 12 tends to be degraded by concentration of grooves for wiring and the like.

In the case where the temperature of the central part of the ceramic base 12 is higher than that of the peripheral part, the heating surface A also has a concave shape where the central part is the lowest point and the peripheral part is the highest point. As shown in FIG. 2A, once a substrate 50 is placed on the heating surface A, the substrate 50 comes into close contact with the peripheral part of the heating surface A due to the own weight. This provides good heat transfer efficiency and the substrate temperature thus increases effectively in the peripheral part. However, in the central part of the substrate 50, there is a small gap between the heating surface A and the substrate 50. Therefore, the heat transfer efficiency is lower than that of the peripheral part.

The efficiency of heat transfer to a substrate 50 is low at the central part of the heating surface A at a higher temperature, whereas the peripheral part of the heating surface A at lower temperature has relatively high efficiency of heat transfer to a substrate 50. Therefore, the temperature distribution of the substrate surface A can be corrected to a uniform distribution.

It is preferred that the temperature difference $\Delta T$ between temperature Tc of the central part of the heating surface A of the ceramic base 12 and temperature T140 of a circumference with a radius of about 140 mm (peripheral part) from the central part of the heating surface A, is not less than about 3° C., more preferably not less than about 5° C., in the substrate heating apparatus 2 with a cylindrical member 30 joined. In other words, heat generated by the high temperature generating region, i.e., the resistance heating element zone 22a is set so that the temperature difference $\Delta T$ between temperature (Tc) and temperature (T140) is equal to or greater than about 3° C. and more preferably equal to or greater than about 5° C., in use. As a result, a compression stress field in the central part of the ceramic base 12 can be formed.

In general, damage to the ceramic base 12 occurs easily when the temperature rises, especially when the temperature rising rate is high in the substrate heating apparatus 2. If the temperature of the central part of the heating surface A to be reached is set at between about 300 and about 500° C., the temperature rising rate is about 10 to about 20° C. per minute, and hardly exceeds 40° C. per minute even for a special purpose. Where $\Delta T$ is equal to or greater than about 3° C., damage to the ceramic base 12 can be prevented at least at a normal temperature rising rate. Where $\Delta T$ is equal to or greater than about 5° C., damage to the ceramic base 12 can be prevented even at a temperature rising rate of about 40° C. per minute. However, if $\Delta T$ is too large, the peripheral part of the ceramic base 12 is easily damaged. Therefore, it is preferred that $\Delta T$ is equal to or less than about 30° C.

The conditions of the concave shape are not limited. It is preferred that the conditions of the concave shape can correct the temperature distribution of the heating surface A of the ceramic base 12. For example, the conditions of the concave shape can vary depending on the conditions of the temperature distribution of the heating surface A of the ceramic base 12. Furthermore, in a ceramic base 12 having a heating surface A whose diameter is about 200 mm to about 300 mm, it is preferred that the concave shape of the heating surface A has a height difference $\Delta H$, between a height Hc of the central part of the heating surface A and a height He of the peripheral part, that is equal to or greater than about 10 μm. As a result, the temperature distribution of the substrate 50 can be corrected effectively. In addition, where $\Delta T$ is equal to or greater than about 5° C., $\Delta H$ is to be equal to or greater than about 28 μm and preferably equal to or greater than about 30 μm. This can obtain temperature uniformity for a substrate surface placed on the heating surface A.

The substrate heating apparatus 2 was described where a multizone heater having a plurality of resistance heating element zones is used and a higher temperature for the resistance heating element zone 22a is set in the central part as a way for forming a high temperature generating region in the central part of the ceramic base 12. However, a method for forming a high temperature generating region in the central part of the ceramic base 12 is not limited to this, and various kinds of ways can be applied. For example, where a resistance heating element buried in the ceramic base 12 is formed by a continuous linear body or ribbon-shaped body, a high temperature generating region can be formed by reducing pitches between neighboring parts of the resistance heating element 22 buried in the central part of the ceramic base so that the density of the resistance heating element 22 in the central part becomes higher.

According to the substrate heating apparatus 2, a high temperature region is formed in the central part of the ceramic base 12, creating a compression stress field in the central part. Therefore, the strength of the ceramic base 12 is enhanced and the degradation of mechanical strength of the ceramic base 12 due to the cylindrical member and grooves for terminals 25a and 25b and wiring can be prevented. In addition, the temperature distribution of the surface of the semiconductor substrate 50 placed on the heating surface A of the substrate heating apparatus 2 can be corrected to achieve a more uniform distribution as an effect of the concave shape of the heating surface A.

Materials for the cylindrical member 30 are not particularly limited. However, similar to the ceramic base 12, a material whose main ingredient is either one of non-oxide ceramics selected from a group of aluminum nitride, silicon nitride, silicon carbide and sialon, or a composite material of at least two non-oxide ceramics selected from the above group. Alternatively, a metal or a composite material of metal and ceramics can be used. Moreover, if the same material as that of the main ingredient of the ceramic base 12 is used for the cylindrical member 30, the difference between the respective heat expansion coefficients can be reduced. Therefore, generation of thermal stress at a junction can be prevented.

Third Embodiment

Figure 3A:
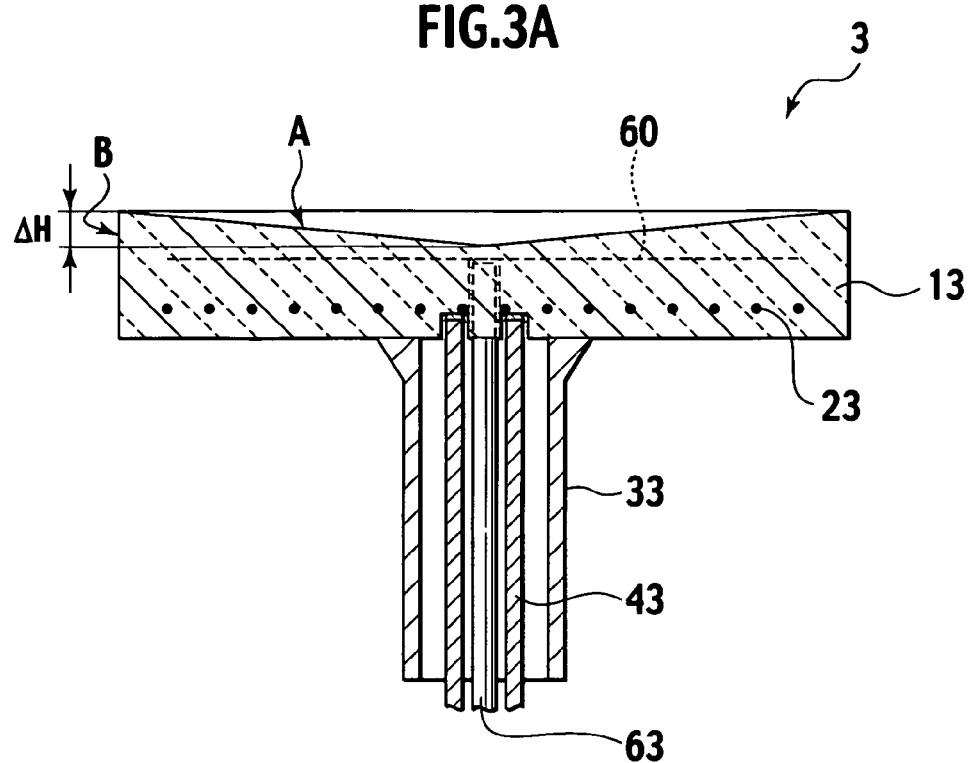
FIGS. 3A and 3B are cross sectional views showing a substrate heating apparatus according to a third embodiment of the present invention.
Figure 3B:
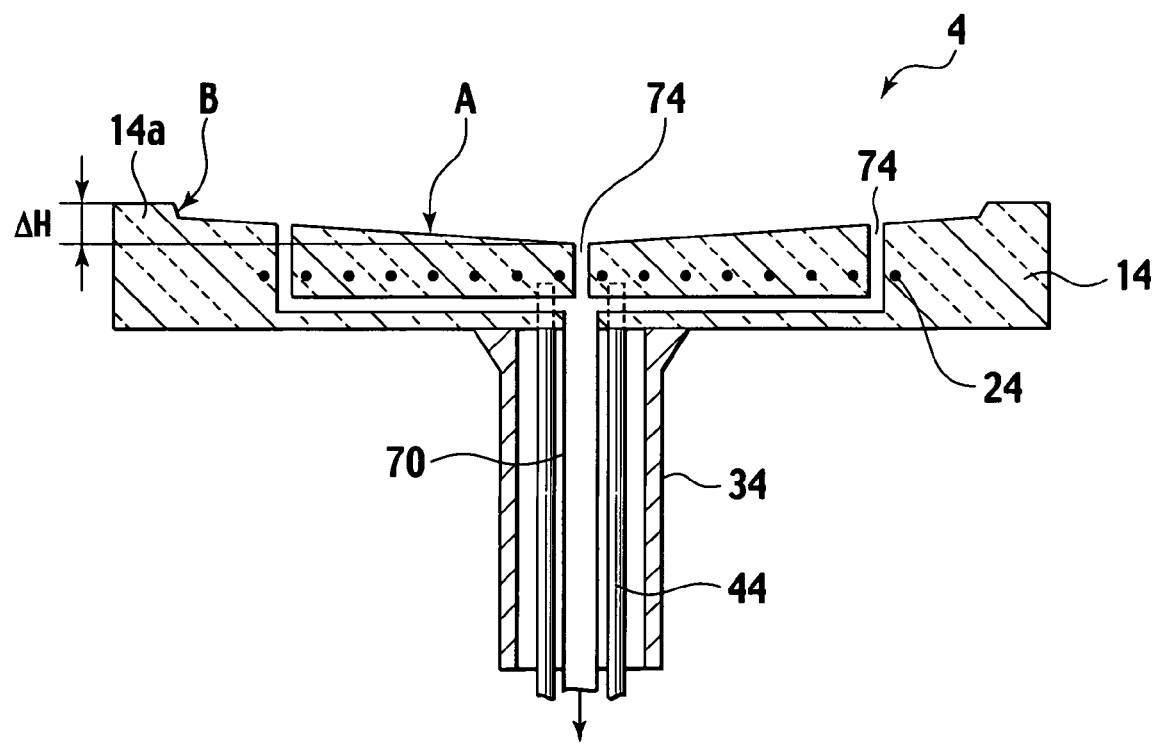

FIGS. 3A and 3B are cross sectional views respectively showing substrate heating apparatuses 3 and 4 with substrate chuck functions according to the third embodiment of the present invention. In the substrate heating apparatus 3 with a substrate electrostatic chuck function shown in FIG. 3A, a resistance heating element 23 and an electrode for electrostatic chuck 60 are buried in a ceramic base 13 formed by an approximately disc-shaped ceramic sintered body. The electrode for electrostatic chuck 60 is buried between the heating surface A and the resistance heating element 23, It is preferred that the electrode for electrostatic chuck 60 is a mesh electrode or a platy electrode with holes. Specifically, the electrode for electrostatic chuck 60 is platy electrode. For example, the electrode for electrostatic chuck 60 can have many holes.

Power supply rods 43 supply power to the resistance heating element 23 via the terminals, and a power supply rod 63 supplies power to the electrode for electrostatic chuck 60 via the terminal. Power supply rods 43 and 63 are accommodated in a cylindrical member 33 joined to the backside of the ceramic base 13. As the cylindrical member 33 is joined to the backside in the central part of the ceramic base 13, temperature of the central part of the heating surface A tends to decrease due to heat transfer from the cylindrical member 33.

However, in the substrate heating apparatus 3 with a substrate electrostatic chuck function, the heating surface A is concave where the central part is the lowest point and the peripheral part is the highest point, similar to the substrate heating apparatus shown in FIG. 1A. If there is no means for holding a substrate placed on the heating surface A, the substrate is likely to be unstable. In the substrate heating apparatus 3 shown in FIG. 3A, a substrate is firmly held to the heating surface A by the electrostatic chuck function.

Since the heating surface A is concave, where the central part is the lowest point, a substrate comes into close contact with the peripheral part of the heating surface A due to chuck force of the electrode for electrostatic chuck 60. Therefore, a substantial contact area of the substrate and the heating surface A is increased. As a result, a high heat transfer efficiency is obtained and the temperature of the substrate rises effectively in the peripheral part. At the same time, in the central part of the substrate, a small gap is made between the heating surface A and the substrate, thus decreasing the heat transfer efficiency. As a result, a high uniform temperature distribution of the surface of the substrate placed on a heating surface A can be achieved.

In addition, in order to effectively correct the temperature distribution of the substrate surface to be uniform, it is preferred that the height difference $\Delta H$ is equal to or greater than about 10 μm, and more preferably equal to or greater than about 28 μm so that a difference of heat transfer efficiency between the central part and the peripheral part of the heating surface A is further clarified in the substrate heating apparatus 3 with a substrate electrostatic chuck function.

The substrate heating apparatus 4 has a substrate vacuum chuck function shown in FIG. 3B The substrate heating apparatus 4 has a vacuum chuck function as the chuck function, which is the difference from the substrate heating apparatus 3 with an substrate electrostatic chuck function shown in FIG. 3A. The rest of the basic construction of the substrate heating apparatus 4 is the same as the substrate heating apparatus 3.

As shown in FIG. 3B, a resistance heating element 24 is buried and chuck holes 74 for vacuum chuck are provided at a plurality of positions in a ceramic base 14. These chuck holes 74 are connected to an exhaust pipe 70. A substrate placed on the heating surface A is held by vacuum chuck to the heating surface A through the respective chuck holes 74. Note that the number and positions of the chuck holes 74 are not particularly limited.

As shown in FIG. 3B, the ceramic base 14 of the substrate heating apparatus 4 may have the ceramic base 14 having the heating surface A, on which a substrate is placed, is provided in the central part and a frame part 14a surrounding the heating surface A and having a height. This makes it easier to secure a vacuum state.

A power supply rod 44 supplying power to the resistance heating element 24 via the terminals, and the exhaust pipe 70 are accommodated in a cylindrical member 34 connected to the backside of the ceramic base 14. Due to heat transfer from the cylindrical member 34, the temperature of the central part of the heating surface A tends to decrease.

In the substrate heating apparatus 4, the heating surface A is a concave where the central part is the lowest point and the peripheral part is the highest point. A substrate comes into close contact with the heating surface A due to chuck force of vacuum chuck, increasing a substantial contact area in the peripheral part. Thus, high heat transfer efficiency is obtained and temperature of the substrate rises effectively in the peripheral part. At the same time, heat transfer efficiency is slightly decreased in the central part of the substrate because of a gap between the heating surface A and the substrate.

In order to obtain a more effective difference of heat transfer efficiency between the central part and the peripheral part of the heating surface A to secure a highly uniform temperature distribution of a substrate surface A, it is preferred that the height difference ΔH is equal to or greater than about 10 μm, and more preferably equal to or greater than 20 μm in the substrate heating apparatus 4 with a substrate vacuum chuck function.

In a case where either an electrostatic chuck and a vacuum chuck is used, if the height difference ΔH is too large, the substrate chuck force in the central part of the heating surface A becomes insufficient, thus destabilizing the substrate. Therefore, it is preferred that the height difference ΔH be equal to or less than about 50 μm.

Manufacturing Method for Substrate Heating Apparatus

Next, a manufacturing method for a substrate heating apparatus according to an embodiment of the present invention is described. Here, a manufacturing method for the substrate heating apparatus 3 with a substrate electrostatic chuck function shown in FIG. 3A of the third embodiment is described as an example. However, the resistance heating element 22 shown in FIGS. 2A and 2B is used as the resistance heating element instead of the resistance heating element 23 shown in FIG. 3A. As for other substrate heating apparatuses, materials for ceramic bases, resistance heating elements, and cylindrical members may be the same as those used for the substrate heating apparatus 3, and each process stated below may be applied as necessary.

In order to manufacture the substrate heating apparatus 3 with a substrate electrostatic chuck function, a ceramic base 13 in which a resistance heating element 22 and an electrode 60 for electrostatic chuck are buried, and a cylindrical member 33 made of a ceramic sintered body are formed first. Next, the heating surface A of the ceramic base 13 is ground so that a central part of the heating surface A is the lowest point and a peripheral part of the heating surface A is the highest point. Next, the cylindrical member 33 is joined to a central region of the ceramic base 13 on an opposite side to the heating surface A. The necessary terminals are connected to the power supply rods 43 and 63. After an inspection process, the substrate heating apparatus 3 is completed.

Below is a more specific description of each process. First, in the ceramic base 13 forming process, a ceramic base compact, in which a resistance heating element 22 and an electrode 60 for electrostatic chuck are buried, is formed. Next, the formed ceramic base compact is sintered to obtain a ceramic sintered body, which is then processed. In processing the ceramic sintered body, the heating surface A of the ceramic base 13 is processed into a concave shape where the central part is the lowest point.

To be more specific, in the ceramic base compact forming process, first, a preform is formed by filling a ceramic raw powder including a ceramic powder and a sintering aid in a metal mold and then pressing. Thereafter, a resistance heating element is placed on the preform, and the ceramic raw powder is filled on the resistance heating element and pressed. For placing the resistance heating element on the preform, grooves may be formed beforehand on the preform in parts where the resistance heating element is placed. Thereafter, an electrode 60 for electrostatic chuck, made of, for example, a metal bulk in a mesh form, is placed on the preform. The ceramic raw powder is further filled and then the entire compact is pressed in an axis direction again. In this manner, the ceramic base compact in which the resistance heating element and the electrode for electrostatic chuck are buried is formed. Note that the ceramic raw powder can include at least one of AlN, SiC, SiNx, Sialon and the like as a main ingredient, and rare-earth oxide such as $Y_2O_3$ added as the sintering aid.

As the resistance heating element 22, two resistance heating element zones 22a and 22b are formed by linear metal bulks. One linear metal bulk is placed in the central part, the other metal bulk is placed in the peripheral part, as shown in FIG. 2B. A single linear metal bulk made of a high melting point material such as Mo, W, WC and the like and folded so that two terminals 25 are brought to the center of the ceramic base 10, for example. Note that various modifications can be made for the resistance heating element 22. The linear metal bulks for the resistance heating element 22 may circle around holes 80 for lift-pins with keeping a constant distance between neighboring linear metal bulks. Moreover, the linear metal bulks for the resistance heating element may be folded to narrow a distance between neighboring linear metal bulks, by giving bulges at folded parts of the linear metal bulks. This distance may be narrowed to achieve high uniform temperature distribution of the heating surface A.

Similar to the resistance heating element, it is preferred that the electrode 60 for electrostatic chuck is an electrode made of a high melting point material, such as Mo, W, WC, and the like which has resistance to sintering temperature. It is also possible to use an electrode made of a metal bulk having a mesh form or a platy metal bulk having many holes such as punching metal. According to using these metal bulks, the resistance of the electrode can be reduced. Therefore, the electrode can be used as a high frequency electrode. Moreover, when a metal bulk body is used, a hot press method can be applied in a sintering process.

It is also possible to use a printed resistance heating element and a printed electrode for an electrostatic chuck. In this case, the printed resistance heating element and the printed electrode for the electrostatic chuck is formed on a green sheet and another green sheet is layered on the printed resistance heating element and the printed electrode for the electrostatic chuck to form the ceramic base compact.

In the ceramic base compact sintering process, the ceramic base compact obtained from the aforementioned forming process is sintered using for example, using a hot pressing method. When aluminum nitride powder is used as the ceramic powder, the ceramic base compact is sintered in a nitride atmosphere for about one to about ten hours at about 1700 to about 2000° C. The pressure of hot pressing is about 20 to about 1000 kg/cm², and more preferably about 100 to about 400 kg/cm². When this hot pressing method is used, pressure is applied in one axis direction during sintering. As a result, good adhesiveness of the resistance heating element 22 and the electrode 60 for the electrostatic chuck to the ceramic base can be achieved. When metal bulks are used as the resistance heating element 22 and the electrode 60 for the electrostatic chuck, the resistance heating element 22 and the electrode 60 for the electrostatic chuck are not deformed due to pressure applied during sintering by the hot pressing method.

The process of processing the ceramic base 13 includes making holes for inserting terminals of the resistance heating element 22 and the electrode 60 in the ceramic sintered body for the ceramic base 13, chamfering, and forming the heating surface A. The heating surface A can be formed by grinding the surface of the ceramic base 13 into a concave. The processing the surface of ceramic base 13 can be carried out using a surface grinder. The heating surface A can be ground so that a height difference ΔH between a height (Hc) of the central part of the heating surface A and a height (He) of the peripheral part of the heating surface A is equal to or greater than about 10 μm and more preferably equal to or greater than about 28 μm. The height difference ΔH is equal to or less than about 50 μm more preferably.

This ceramic base processing can be performed after sintering is completed or before sintering is completed. The processing can be carried out for a presintered body obtained by sintering at temperature slightly lower than that for final sintering or sintering for a short time. According to using the presintered body, the processing can be performed more easily. When a presintered body is used for processing, the presintered body after the processing is sintered again.

Figure 4A:
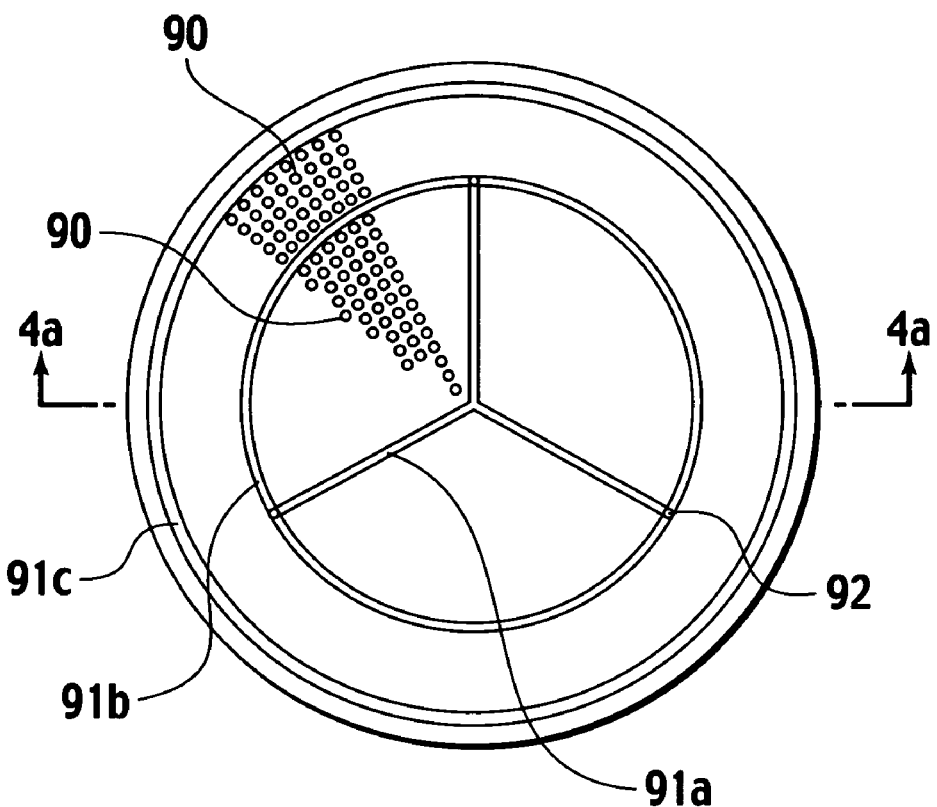
FIGS. 4A and 4B are a plan view and a cross sectional respectively, showing a substrate heating apparatus having a heating surface which is embossed.
Figure 4B:
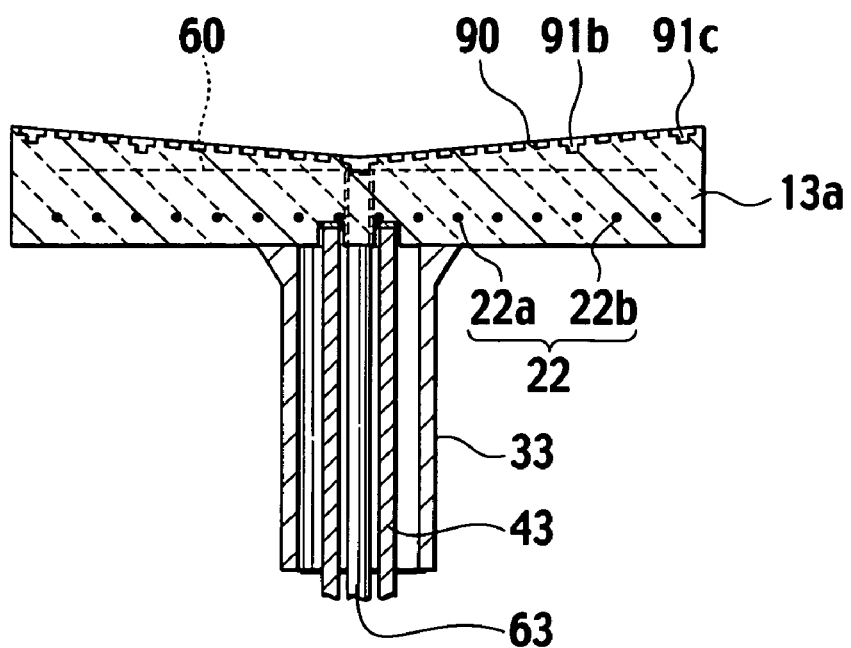

In the ceramic base processing process, embosses 90 may be formed on the heating surface of the ceramic base 13a by sand blasting or the like as shown in FIGS. 4A and 4B. In addition, holes for purge gas 92, channels for purge gas 91a and 91b and 91c, holes for lift-pins or the like may be formed.

In the cylindrical member forming process, a cylindrical member compact is formed first by using ceramic raw powder. Next, the formed cylindrical member compact is sintered. Then the sintered body for the cylindrical member 33 is processed.

In the cylindrical member compact forming process, it is preferred to use the same ceramic raw powder as the ceramic raw powder for ceramic base 13 in order to join well the cylindrical member to the ceramic base 13. As for a forming method, various methods may be applied, but CIP (cold isostatic pressing), slip casting or the like is preferred.

In the cylindrical member sintering process, the cylindrical member compact obtained in the abovementioned forming process is sintered. However, since the shape of the cylindrical member compact is complex, it is preferred to use atmospheric pressure sintering method. When AlN is used as ceramic powder, the cylindrical member compact is sintered in a nitrogen atmosphere for about one to about ten hours at temperature about 1700 to about 2000° C.

In the cylindrical member compact processing process, lapping or the like is performed on the surface of the sintered body and joint surface to the ceramic base 13 of same. Thereafter, the ceramic base 13 and the cylindrical member 33 are joined together. In this joining process, a joining agent including AlN powder and rear-earth oxide is applied to one of or both joint surfaces. Thereafter, the joint surfaces are joined together and pressed in one axis direction from a direction vertical to the joint surfaces. Heat treatment is then performed at about 1400 to about 1600° C. in nitrogen atmosphere while applying a predetermined pressure to the joint surfaces. As a result, solid-state welding of the ceramic base 13 and the cylindrical member 33 is completed. Note that soldering or mechanical bonding may be performed in stead of solid state welding.

Moreover, the terminals for the resistance heating element 22 and the electrode 60 in the ceramic base 13 and power supply rods 43 and 63 made of Ni or the like are connected together by soldering. After connecting the terminals, uniform temperature distribution and uniform chuck force are inspected, thus completing a substrate heating apparatus 3 with electrostatic chuck.

There are no particular limits on the size and shape of the ceramic base and the cylindrical member. However, when the diameter of the heating surface of the ceramic base is D1 and a cross sectional diameter of the cylindrical member is D2, it is preferred that D2/D1 is between about ½ and about ¹⁄₁₀. This further ensures that an effect which the heating surface is the concave is obtained.

Note that, after the inspection process, processing for correcting the heating surface of the ceramic base based on the result of the inspection is carried out.

When the substrate heating apparatus 1 or 2 with no chuck function is formed, the process of forming the electrode 60 for electrostatic chuck may be omitted. When the substrate heating apparatus with a substrate vacuum chuck function 4 which has a vacuum chuck function, shown in FIG. 3B, is formed, chuck holes 74 for vacuum chuck are formed. Therefore, for example, the ceramic base is divided into a plurality of pieces, and preforms of these pieces are formed. Thereafter, grooves are formed in the preforms and then the preforms are joined together, thus creating chuck holes 74.

As described so far, according to the manufacturing method for the substrate heating apparatus, a high uniform temperature distribution of the substrate can be achieved by a simple process of grinding the heating surface into a concave. This method is very practical because what is needed is only to add the simple process to a conventional process. Moreover, processing for correcting after inspections can be added to the manufacturing method if necessary.

EXAMPLES

Hereinafter, examples of the present invention are described. Substrate heating apparatuses 3 with a substrate electrostatic chuck function shown in FIG. 3A are manufactured as examples 1 to 7. However, the resistance heating element 22 shown in FIGS. 2A and 2B is used as the resistance heating element instead of the resistance heating element 23 shown in FIG. 3A. These apparatuses are manufactured under the same conditions except those for grinding heating surfaces of ceramic bases into concaves.

First of all, ceramic bases in which resistance heating element and electrode for electrostatic chuck are buried are formed. Ceramic raw powder is prepared by adding about 5% by weight of $Y_2O_3$ to AlN powder obtained by reductive nitriding, and an acrylic resin binder is added to the ceramic raw powder. The ceramic raw powder with the binder is granulated by spray granulation to obtain the granulated powder. This granulated powder is filled in a metal mold and pressed to form preforms. Thereafter, grooves are made by a transfer pattern at positions on each preform where resistance heating element is to be buried. Two linear metal bulks with a wire diameter of 0.5 mm which are made of Mo and folded as shown in FIG. 2B are placed on the grooves as the resistance heating element. Then the granulated powder is filled and pressed. Further, a metal bulk with a wire diameter of 0.35 mm which is made of a Mo and mesh form with 24 meshes is placed on the granulated powder as an electrode for electrostatic chuck. Then the granulated powder is filled, and the entire body is pressed in one axis direction. Each press pressure is 200 kg/cm². In the above manner, ceramic base compacts in which the resistance heating element and the electrode for electrostatic chuck are buried, are formed.

Ceramic base compacts are removed from the metal mold and then sintered in a hot press sintering furnace. For this sintering, the ceramic base compacts are held for six hours at 1860° C. in atmosphere which a nitrogen gauge pressure is 0.5 kg/cm². The sintered bodies thus obtained have an outer diameter of about 290 mm, and a thickness of about 17 mm. Burying positions of the resistance heating element and the electrode for electrostatic chuck are at a depth of 8.5 mm and 1.0 mm from the heating surface before processing, respectively.

Holes for lift-pins and purge gas are formed in the sintered bodies thus obtained. Moreover, the surface of each ceramic base, serving as a heating surface, is ground using a rotary surface grinder with 200-mesh diamond polishing paper and a grind stone. Accordingly, as shown in Table 1, each heating surface is ground into a concave which the central part is the lowest point and the peripheral part is the highest point. Each height difference ΔH (=Hc−He) between a height (Hc) of the central part and a height (He) of the peripheral part of each heating surface is set to each predetermined value as shown in Table 1.

On the other hand, the cylindrical members are formed under the following conditions. Ceramic raw powder is prepared by adding 5% by weight of $Y_2O_3$ t to AlN powder obtained by reductive nitriding, and an acrylic resin binder is added to the ceramic raw powder. The ceramic raw powder with the binder is granulated by spray granulation to obtain the granulated powder. By using this granulated powder, cylindrical member compacts are formed by a CIP method.

Next, the cylindrical member compacts are sintered by atmospheric pressure sintering method. For this sintering, the cylindrical member compacts are held for 3 hours at 1850° C. A diameter of a middle part of cylindrical members obtained after the sintering is about 40 mm, and a length of cylindrical members is about 200 mm. A wall thickness near the middle part of cylindrical members is about 3 mm. An yttrium nitrate solution with an yttrium concentration of $2.6 \times 10^{-6}$ mol/cc is applied to the joint surfaces of cylindrical members and ceramic bases. Thereafter, the cylindrical members and the ceramic bases are joined together and heat-treated for two hours in nitrogen atmosphere at 1800° C.

After the joining, power supply rods made of Ni are soldered to terminals for the resistance heating elements and the electrodes for electrostatic chuck buried in ceramic bases.

Evaluation 1

These substrate heating apparatuses with cylindrical members of Examples 1 to 7 having different concaves of heating surfaces are placed in a sealed chamber for evaluation, and a silicon substrate with a diameter of 300 mm is placed on each heating surface. Inside of the chamber is under 77 pa vacuum. Power is supplied to the resistance heating elements while the substrates are fixed on the heating surfaces by chuck force through supplying to the electrodes for electrostatic chuck. Note that the set temperature of both center part and peripheral part of the heating surfaces is 450° C. Under the above conditions, a relationship between temperature distribution of each substrate and a height deference ΔH between the central part and the peripheral part of the heating surface of each ceramic base is evaluated. The circumference of the substrate with a radius of 140 mm from the central part, is divided into eight equal parts and substrate surface temperature of each of the eight parts is measured by a thermo viewer. The average temperature of these eight parts is obtained as substrate temperature (Ts140) of the peripheral part. The temperature distribution of the substrate is evaluated based on temperature difference (ΔTs) of the substrate between the substrate temperature (Ts140) of the peripheral part obtained as above and the substrate temperature (Tsc) of the central part of the substrate.

As shown in Table 1, it was confirmed that the temperature distribution of the substrate can be varied since the heating surface is concave and the height difference ΔH between the central part and the peripheral part is changed. As the height difference ΔH increases, the substrate temperature of the central part can be set lower than that of the peripheral part even if temperature distribution of the heating surface is uniform.

TABLE 1

|  | WORKING EXAMPLE 1 | WORKING EXAMPLE 2 | WORKING EXAMPLE 3 | WORKING EXAMPLE 4 | WORKING EXAMPLE 5 | WORKING EXAMPLE 6 | WORKING EXAMPLE 7 |
| --- | --- | --- | --- | --- | --- | --- | --- |
| HEIGHT DIFFERENCE ΔH = (He − Hc) (μm) | 3 | 5 | 12 | 28 | 35 | 43 | 51 |
| TEMPERATURE DIFFERENCE OF SUBSTRATE ΔTs = Tsc − Ts140 (° C.) | −1 | −1 | −3 | −5 | −6 | −7 | −8 |

Evaluation 2

In Examples 1 to 4 of substrate heating apparatuses with cylindrical members, a relationship among the temperature difference ΔT between the central part and the peripheral part of the heating surface of the ceramic base, the temperature rising rate, and the probability of damage was evaluated. Note that the temperature (T140) of the peripheral part of the heating surface is an average value of temperature of heating surfaces in eight equal parts of the circumference with a radius of 140 mm from the central part of a heating surface. An average temperature of the peripheral part of a ceramic base is set about 450° C. The substrate heating apparatuses of Examples 1 to 4 are formed to confirm a relationship between the temperature of the central part of the ceramic base and damage. Therefore, the heating surfaces are remained flat. Other conditions of forming are the same as those used for Examples 1 to 7. Table 2 shows the results of the evaluation. For determination of presence of damage, conditions of temperature rising of the substrate heating apparatus, where damage to a ceramic base is most likely to occur, are used. Note that temperature rising rate of these substrate heating apparatuses is 10 to 40° C. per minute in view of a high temperature rising rate which may be used in an evaluation process or the like other than actual thin-film forming process. Before a cylindrical member is joined to the ceramic base, the temperature of the central part of a ceramic base is 19 to 20° C. higher than that after joining the cylindrical member.

TABLE 2

|  | EXAMPLE 1 | | | | EXAMPLE 2 | | | | EXAMPLE 3 | | | | EXAMPLE 4 | | | |
| --- | --- | --- | --- | --- | --- | --- | --- | --- | --- | --- | --- | --- | --- | --- | --- | --- |
| TEMPERATURE DIFFERENCE OF HEATING SURFACE $\Delta T = Tc - T140$ (° C.) | 3 | | | | 5 | | | | 10 | | | | 20 | | | |
| TEMPERATURE RISING RATE (° C./min) | 10 | 20 | 30 | 40 | 10 | 20 | 30 | 40 | 10 | 20 | 30 | 40 | 10 | 20 | 30 | 40 |
| DAMAGE | ○ | ○ | X | — | ○ | ○ | ○ | ○ | ○ | ○ | ○ | ○ | ○ | ○ | ○ | ○ |

In Table 2, symbol "○" indicates that damage does not occur, and symbol "x" indicates that damage occurs. According to the results shown in Table 2, it is confirmed that, when the temperature of the substrate is increased at a high rate of 30° C. per minute or higher in the substrate heating apparatus with the cylindrical member, it is preferred that the temperature of the central part of the heating surface of the ceramic base is higher than that of the peripheral part thereof by 5° C. or greater to form a compression stress field in the central part, in order to prevent damages due to thermal stress.

On the other hand, according to the results of Table 1, it is confirmed that, when the temperature difference $\Delta T$ between the central part and the peripheral part of the heating surface of the ceramic base is 5° C. or higher, it is preferred that the height difference $\Delta H$ between the central part and the peripheral part of the concave, i.e. the heating surface of the ceramic base is equal to or greater than 28 μm in order to obtain a uniform temperature distribution of the surface of the placed substrate.

Accordingly, it is confirmed that, by forming a heating surface of a ceramic base into a concave, a uniform temperature distribution of the surface of the placed substrate is obtained while improving strength of the ceramic base.

Although the inventions have been described above by reference to certain embodiments of the inventions, the inventions are not limited to the embodiments described above. Modifications and variations of the embodiments described above will occur to those skilled in the art, in light of the above teachings.

What is claimed is:

1. A substrate heating apparatus comprising:
   a ceramic base including a concave heating surface on which a substrate is placed, wherein a central part of the concave heating surface defines a lowermost point of the concave heating surface and a peripheral part of the concave heating surface defines on uppermost point of the concave heating surface; and
   a resistance heating element buried in the ceramic base;
   wherein a height difference $\Delta H$ between a height (Hc) of the central part of the concave heating surface and a height (He) of the peripheral part of the concave heating surface is in a range of 10 μm to less than 50 μm.

2. The substrate heating apparatus according to claim 1, wherein the height difference $\Delta H$ is at least about 28 μm.

3. The substrate heating apparatus according to claim 1, further comprising a cylindrical member joined to a central region of a surface of the ceramic base opposing the heating surface.

4. The substrate heating apparatus according to claim 3, wherein the resistance heating element has a high temperature generating region generating a higher temperature than a temperature of a periphery of a region including a junction of the cylindrical member in the region.

5. The substrate heating apparatus according to claim 4, wherein the resistance heating element has a plurality of resistance heating element zones, the resistance heating element zones have respective terminals, and the high temperature generating region is a resistance heating element zone located in a central region of the ceramic base.

6. The substrate heating apparatus according to claim 4, wherein heat generated by the high temperature generating region is set so that a temperature difference $\Delta T$ between a temperature (Tc) of the central part and a temperature (T140) of a circumference with a radius of about 140 mm from the central part of the heating surface is equal to or greater than about 3° C.

7. The substrate heating apparatus according to claim 3, wherein the ceramic base comprises at least one of aluminum nitride, silicon nitride, silicon carbide and sialon, and the cylindrical member comprises the same material as the ceramic base.

8. The substrate heating apparatus according to claim 1, further comprising an electrode buried in the ceramic base between the heating surface and the resistance heating element.

9. The substrate heating apparatus according to claim 8, wherein the electrode is one of a mesh electrode and a platy electrode with holes.

10. The substrate heating apparatus according to claim 1, wherein the ceramic base comprises at least one of aluminum nitride, silicon nitride, silicon carbide and sialon.

* * * * *